United States Patent
Moeggenborg et al.

(10) Patent No.: US 6,974,777 B2
(45) Date of Patent: Dec. 13, 2005

(54) CMP COMPOSITIONS FOR LOW-K DIELECTRIC MATERIALS

(75) Inventors: Kevin J. Moeggenborg, Naperville, IL (US); Homer Chou, Hoffman Estates, IL (US); Joseph D. Hawkins, Aurora, IL (US); Jeffrey P. Chamberlain, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 240 days.

(21) Appl. No.: 10/165,100

(22) Filed: Jun. 7, 2002

(65) Prior Publication Data

US 2003/0228762 A1 Dec. 11, 2003

(51) Int. Cl.[7] .................... H01L 21/302; C09K 13/00; C09K 13/06
(52) U.S. Cl. ................. 438/692; 252/79.1; 252/79.4
(58) Field of Search .................. 438/692; 252/79.1, 252/79.4

(56) References Cited

U.S. PATENT DOCUMENTS

| | | | |
|---|---|---|---|
| 5,527,423 A | 6/1996 | Neville et al. | 438/693 |
| 5,849,233 A | 12/1998 | Altieri et al. | 264/211.11 |
| 5,958,794 A | 9/1999 | Bruxvoort et al. | 438/692 |
| 6,043,155 A | 3/2000 | Homma et al. | 438/691 |
| 6,046,112 A | 4/2000 | Wang | 438/693 |
| 6,062,968 A | 5/2000 | Sevilla et al. | 451/526 |
| 6,117,000 A | 9/2000 | Anjur et al. | 451/526 |
| 6,126,532 A | 10/2000 | Sevilla et al. | 451/526 |
| 6,153,525 A | 11/2000 | Hendricks et al. | 438/692 |
| 6,270,393 B1 | 8/2001 | Kubota et al. | 451/36 |
| 6,270,395 B1 | 8/2001 | Towery et al. | 451/41 |
| 6,313,039 B1 | 11/2001 | Small et al. | 438/693 |
| 6,348,076 B1 | 2/2002 | Canaperi et al. | 51/309 |
| 6,376,381 B1 * | 4/2002 | Sabde | 438/693 |
| 6,383,240 B1 | 5/2002 | Nishimoto et al. | 51/307 |
| 6,420,269 B2 * | 7/2002 | Matsuzawa et al. | 438/693 |
| 2001/0005009 A1 | 6/2001 | Tsuchiya et al. | 252/79.1 |
| 2001/0008828 A1 | 7/2001 | Uchikura et al. | 451/41 |
| 2001/0013507 A1 | 8/2001 | Hosali et al. | 216/89 |
| 2001/0054706 A1 | 12/2001 | Levert et al. | 252/79.1 |
| 2002/0016060 A1 * | 2/2002 | Matsuzawa et al. | 438/633 |
| 2002/0023389 A1 * | 2/2002 | Minamihaba et al. | 51/308 |

FOREIGN PATENT DOCUMENTS

| | | |
|---|---|---|
| EP | 1 088 869 A1 | 4/2001 |
| EP | 0 810 302 B1 | 8/2001 |
| EP | 1 148 538 A1 | 10/2001 |
| WO | WO 00/49647 A1 | 8/2000 |
| WO | WO 01/32794 A1 | 5/2001 |

OTHER PUBLICATIONS

McClatchie S. et al., "Low Dielectric Constant Oxide Films Deposited Using CVD Techniques" DUMIC Conference Proceedings, Feb., 1998, pps. 311–318.

* cited by examiner

*Primary Examiner*—Nadine G. Norton
*Assistant Examiner*—Lynette T. Umez-Eronini
(74) *Attorney, Agent, or Firm*—Robert Lanning

(57) ABSTRACT

The invention provides a method of polishing a substrate containing a low-k dielectric layer comprising (i) contacting the substrate with a chemical-mechanical polishing system comprising (a) an abrasive, a polishing pad, or a combination thereof, (b) an amphiphilic nonionic surfactant, and (c) a liquid carrier, and (ii) abrading at least a portion of the substrate to polish the substrate.

32 Claims, 1 Drawing Sheet

CMP COMPOSITIONS FOR LOW-K DIELECTRIC MATERIALS

FIELD OF THE INVENTION

This invention pertains to chemical-mechanical polishing compositions for polishing low-k dielectric materials.

BACKGROUND OF THE INVENTION

Compositions and methods for planarizing or polishing the surface of a substrate are well known in the art. Polishing compositions (also known as polishing slurries) typically contain an abrasive material in an aqueous solution and are applied to a surface by contacting the surface with a polishing pad saturated with the polishing composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. The polishing slurry is typically used in conjunction with a polishing pad (e.g., polishing cloth or disk). Suitable polishing pads are described in U.S. Pat. Nos. 6,062,968, 6,117,000, and 6,126,532, which disclose the use of sintered polyurethane polishing pads having an open-celled porous network, and U.S. Pat. No. 5,489,233, which discloses the use of solid polishing pads having a surface texture or pattern. Alternatively, the abrasive material may be incorporated into the polishing pad. U.S. Pat. No. 5,958,794 discloses a fixed abrasive polishing pad.

Polishing compositions for silicon-based inter-metal dielectric layers have been particularly well developed in the semiconductor industry, and the chemical and mechanical nature of polishing and wear of the silicon-based dielectrics is reasonably well understood. One problem with the silicon-based dielectric materials, however, is that their dielectric constant is relatively high, being approximately 3.9 or higher, depending on factors such as residual moisture content. As a result, the capacitance between the conductive layers is also relatively high, which in turn limits the speed (frequency) at which the circuit can operate. Strategies being developed to reduce the capacitance include (1) incorporating metals with lower resistivity values (e.g., copper), and (2) providing electrical isolation with insulating materials having lower dielectric constants relative to silicon dioxide. Such low dielectric constant materials typically include organic polymer materials, inorganic and organic porous dielectric materials, and blended or composite organic and inorganic materials, which can be porous or non-porous. It would be highly desirable to incorporate low dielectric constant materials into semiconductor structures while still being able to utilize the conventional chemical-mechanical polishing (CMP) systems for polishing the surface of the resulting dielectric material during the semiconductor wafer processing.

Several chemical-mechanical polishing compositions for substrates containing low dielectric constant materials are known. For example, U.S. Pat. No. 6,043,155 discloses a cerium oxide-based slurry for inorganic and organic insulating films. U.S. Pat. No. 6,046,112 discloses a polishing composition for polishing low dielectric materials comprising zirconia abrasive and either tetramethylammonium hydroxide or tetrabutylammonium hydroxide. U.S. Pat. No. 6,270,395 discloses a polishing composition for low dielectric materials comprising abrasive and an oxidizing agent.

Surfactants are commonly used in chemical-mechanical polishing compositions to function as dispersants or flocculating agents. For example, U.S. Pat. No. 6,270,393 discloses an abrasive slurry comprising alumina, an inorganic salt, a water-soluble chelating agent, and a surfactant which purportedly acts as a dispersant for the abrasive. U.S. Pat. No. 6,313,039 discloses a polishing composition comprising an abrasive, an hydroxylamine compound, an oxidizing agent, and optionally a surfactant that purportedly alters the surface charge on the substrate being polished. U.S. Pat. No. 6,348,076 discloses polishing compositions for metal layer CMP comprising surfactants, in particular anionic surfactants. U.S. Published Patent Application 2001/0005009 A1 discloses polishing compositions comprising surfactants, including anionic, cationic, ampholytic, and nonionic surfactants, to act as dispersing agents. U.S. Published Patent Application 2001/0008828 A1 discloses an aqueous polishing composition for copper and barrier film polishing comprising an abrasive, an organic acid, a heterocyclic compound, an oxidizer, and optionally a surfactant. U.S. Published Patent Application 2001/0013507 A1 discloses a method of polishing low dielectric constant inorganic polymer layers comprising zironica abrasive and a nonionic, anionic, cationic, or amphoteric surfactant, which purportedly acts to stabilize the polishing slurry against settling, flocculation, and decomposition. WO 01/32794 A1 discloses a tantalum barrier slurry for CMP comprising an organic additive, which can be any of a variety of surfactants, that purportedly forms bonds with the surface of the silica or copper substrate and suppresses formation of silica precipitates and copper staining. EP 810 302 B1 discloses a polishing composition comprising a sorbitan fatty acid ester and a polyoxyethylene derivative of a sorbitan fatty acid ester as corrosion inhibitors. EP 1 088 869 A1 discloses an aqueous dispersion for CMP comprising abrasive particles and an amphipathic surfactant having an HLB value of 6 or lower. EP 1 148 538 A1 discloses a polishing composition comprising cerium oxide abrasive and a surfactant (e.g., anionic, nonionic, cationic, or amphoteric) that purportedly acts as a dispersant.

Though the use of surfactants in chemical-mechanical polishing compositions is well known, none of the prior art references recognizes the particular benefits of nonionic surfactants as compared to other types of surfactants, such as anionic, cationic, and amphoteric surfactants. It has been found that nonionic surfactants can provide improved selectivity in substrate layer removal rates. These and other advantages of the invention, as well as additional inventive features, will be apparent from the description of the invention provided herein.

BRIEF SUMMARY OF THE INVENTION

The invention provides a method of polishing a substrate comprising (i) contacting the substrate comprising a dielectric layer with a chemical-mechanical polishing system comprising (a) an abrasive, a polishing pad, or a combination thereof, (b) an amphiphilic nonionic surfactant, and (c) a liquid carrier, and (ii) abrading at least a portion of the substrate to polish the dielectric layer, wherein the dielectric layer has a dielectric constant of about 3.5 or lower.

DETAILED DESCRIPTION OF THE INVENTION

Figure 1:
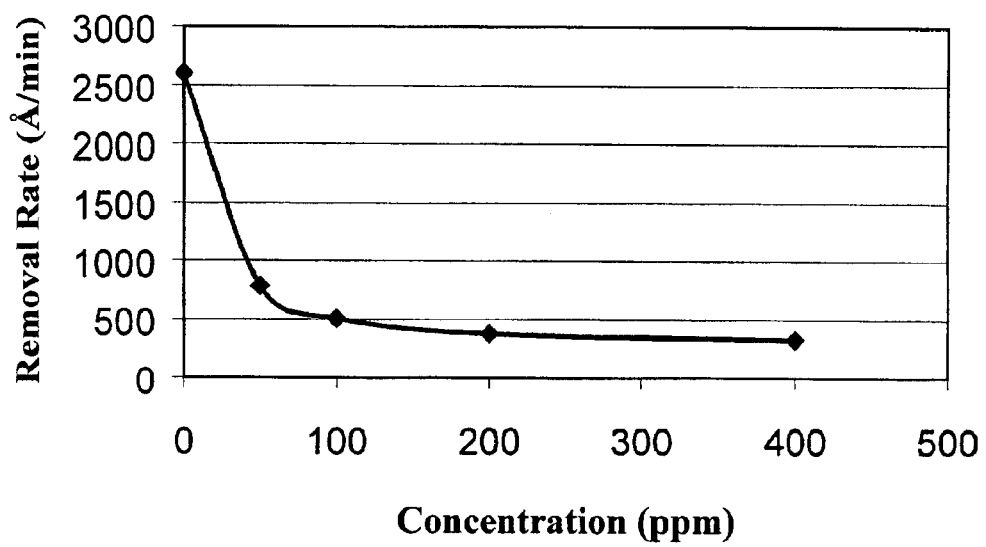
FIG. 1 is a plot showing the relationship between the surfactant concentration and the removal rate of the low-k dielectric material.

The invention is directed to a method of polishing a substrate comprising (i) contacting the substrate with a chemical-mechanical polishing system comprising (a) an abrasive, a polishing pad, or a combination thereof, (b) an amphiphilic nonionic surfactant, and (c) a liquid carrier, and (ii) abrading at least a portion of the substrate to polish the substrate.

The chemical-mechanical polishing system described herein comprises an abrasive, a polishing pad, or both. Preferably, the CMP system comprises both an abrasive and a polishing pad. The abrasive can be in any suitable form (e.g., abrasive particles). The abrasive can be fixed on the polishing pad and/or can be in particulate form and suspended in the liquid carrier. The polishing pad can be any suitable polishing pad. The abrasive (when present and suspended in the liquid carrier) and the amphiphilic nonionic surfactant, as well as any other components suspended in the liquid carrier, form the polishing composition of the CMP system.

The abrasive can be any suitable abrasive (e.g., a metal oxide). For example, the abrasive can be a metal oxide abrasive selected from the group consisting of alumina, silica, titania, ceria, zirconia, germania, magnesia, co-formed products thereof, and combinations thereof. The abrasive can also be a polymer particle or a coated particle. Typically, the abrasive is selected from the group consisting of alumina, silica, co-formed products thereof, coated metal oxide particles, polymer particles, and combinations thereof. Preferably, the abrasive is silica. The polishing system typically comprises about 0.1 wt. % to about 20 wt. % (e.g., about 0.5 wt. % to about 15 wt. %, or about 1 wt. % to about 10 wt. %) abrasive, based on the weight of the liquid carrier and any compounds dissolved or suspended therein.

The amphiphilic nonionic surfactant is a surfactant having a hydrophilic portion and a hydrophobic portion. For the purposes of this invention, the amphiphilic nonionic surfactant is defined as having a head group and a tail group. The head group is the hydrophobic portion of the surfactant, and the tail group is the hydrophilic portion of the surfactant. Any suitable head group and any suitable tail group can be used. The amphiphilic nonionic surfactant can comprise any suitable combination of head groups and tail groups. For example, the amphiphilic nonionic surfactant can comprise only one head group in combination with one tail group, or in some embodiments, can comprise multiple (e.g., 2 or more) head groups and/or multiple (e.g., 2 or more) tail groups. Preferably, the amphiphilic nonionic surfactant is water-soluble.

The head group can be any suitable group that is substantially hydrophobic. For example, suitable head groups include polysiloxanes, tetra-$C_{1-4}$-alkyldecynes, saturated or partially unsaturated $C_{6-30}$ alkyls, polyoxypropylenes, $C_{6-12}$ alkyl phenyls or cyclohexyls, polyethylenes, or mixtures thereof. The saturated or partially unsaturated $C_{6-30}$ alkyls optionally can be substituted with functional groups, for example short chain ($C_{1-5}$) alkyls, $C_{6-30}$ aryls, short chain ($C_{1-5}$) fluorocarbons, hydroxyls groups, halo groups, carboxylic acids, esters, amines, amides, glycols, and the like. Preferably, when the head group is a saturated or partially unsaturated $C_{6-30}$ alkyl, the degree of substitution with hydrophilic groups is very low (e.g., fewer than about 3, or fewer than about 2, hydrophilic groups). More preferably, the head group is not substituted with hydrophilic groups (e.g., hydroxyl groups and carboxylic acid groups).

The tail group can be any suitable group that is substantially hydrophilic. For example, suitable tail groups include those comprising a polyoxyethylene group, preferably having about 4 or more (e.g., about 6 or more or about 8 or more) ethylene oxide repeating units, a sorbitan group, highly substituted saturated or partially unsaturated $C_{6-30}$ alkyls, or a mixture thereof (e.g., polyoxyethylenesorbitan). The highly substituted saturated or partially unsaturated $C_{6-30}$ alkyls preferably are substituted with hydrophilic functional groups, for example hydroxyl groups.

The amphiphilic nonionic surfactant can be an acetylenic glycol surfactant comprising a tetraalkyldecyne head group and an oxyethylene tail group, as in 2,4,7,9-tetramethyl-5-decyne-4,7-diol ethoxylate. The amphiphilic nonionic surfactant also can be selected from the group consisting of polyoxyethylene alkyl ethers and polyoxyethylene alkyl acid esters, wherein alkyl is a $C_{6-30}$ alkyl, which can be saturated or partially unsaturated, and is optionally branched. For example, the amphiphilic nonionic surfactant can be a polyoxyethylene lauryl ether, polyoxyethylene cetyl ether, polyoxyethylene stearyl ether, polyoxyethylene oleyl ether, polyoxyethylene monolaurate, polyoxyethylene monostearate, polyoxyethylene distearate, or polyoxyethylene monooleate. Similarly, the amphiphilic nonionic surfactant can be a polyoxyethylene alkylphenyl ether or a polyoxyethylene alkylcyclohexyl ether, wherein alkyl is a $C_{6-30}$ alkyl, can be saturated or partially unsaturated, and can be optionally branched, such as a polyoxyethylene octyl phenyl ether or a polyoxyethylene nonyl phenyl ether.

The amphiphilic nonionic surfactant also can be a sorbitan alkyl acid ester or a polyoxyethylenesorbitan alkyl acid ester, wherein the alkyl is a $C_{6-30}$ alkyl, can be saturated or partially unsaturated, and can be optionally branched. For example, the amphiphilic nonionic surfactant can be sorbitan monolaurate, sorbitan monooleate, sorbitan monopalmitate, sorbitan monostearate, sorbitan sesquioleate, sorbitan trioleate, or sorbitan tristearate, as well as a polyoxyethylenesorbitan monolaurate, polyoxyethylenesorbitan monopalmitate, polyoxyethylenesorbitan monostearate, polyoxyethylenesorbitan tristearate, polyoxyethylenesorbitan monooleate, polyoxyethylenesorbitan trioleate, or polyoxyethylenesorbitan tetraoleate.

The amphiphilic nonionic surfactant can be a block or graft copolymer comprising polydimethylsiloxane and polyoxyethylene, polyoxyethylene and polyoxypropylene, or polyoxyethylene and polyethylene. The amphiphilic nonionic surfactant also can be a polyoxyethylene alkyl amine (e.g., polyoxyethylene lauryl amine, polyoxyethylene stearyl amine, polyoxyethylene oleyl amine), an ethoxylated amide, an ethoxylated alkyl alkanolamide, an alkyl polyglucose (e.g., Plantaren® surfactants available from Henkel), or an ethoxylate ester or diester of an alkyl glucose (e.g., PEG-120 methyl glucose dioleate and the like, available from Amerchol).

Preferred amphiphilic nonionic surfactants include polyoxyethylenesorbitan alkyl acid esters (e.g., polyoxyethylenesorbitan monolaurate, polyoxyethylenesorbitan monopalmitate, polyoxyethylenesorbitan sesquioleate, and polyoxyethylenesorbitan trioleate), alkylphenyl polyoxyethylenes (e.g., Igepal® surfactants, Rhone-Poulenc), and acetylenic diol based surfactants (e.g., Surfynol® surfactants, Air Products).

The polishing system typically comprises about 0.002 wt. % or more amphiphilic nonionic surfactant, based on the weight of the liquid carrier and any compounds dissolved or suspended therein. Preferably, the polishing system comprises about 0.005 wt. % to about 1.0 wt. % (e.g., about 0.01 wt. % to about 0.5 wt. %) amphiphilic nonionic surfactant, based on the weight of the liquid carrier and any compounds dissolved or suspended therein. The amount of amphiphilic nonionic surfactant in part depends on the type of surfactant. For example, when the amphiphilic nonionic surfactant is a copolymer of ethylene oxide and propylene oxide (e.g., Pluronic® L101 or Pluronic® 31R1 surfactants, BASF), the amount of amphiphilic nonionic surfactant is preferably about 0.05 wt. % or less (e.g., about 0.02 wt. % or less, or about 0.01 wt. % or less). When the surfactant is a sorbitan fatty acid ester (e.g., sorbitan monolaurate, sorbitan monopalmitate, sorbitan sesquioleate, sorbitan trioleate), the amount of the amphiphilic nonionic surfactant is preferably 0.01 wt. % or more (e.g., about 0.02 wt. % or more, or about 0.05 wt. % or more).

The amphiphilic nonionic surfactant typically has a hydrophilic-lipophilic balance (HLB) value of about 7 or greater (e.g., about 10 or greater, or about 12 or greater). The HLB value indicates the solubility of a surfactant in water and, thus, is related to the wt. % amount of the hydrophilic portion of the surfactant (e.g., the wt. % amount of ethylene oxide). The surfactant HLB value can be approximated, in some cases, for nonionic surfactants containing an ethylene oxide group as being equal to the wt. % amount of the ethylene oxide groups divided by 5. A low HLB value indicates a lipophilic surfactant (i.e., having a small number of hydrophilic groups), and a high HLB value indicates a hydrophilic surfactant (having a high number of hydrophilic groups).

The type of amphiphilic nonionic surfactant selected for use in a chemical-mechanical polishing system of the invention depends in part on the type of substrate being polished. For example, when the low-k dielectric layer is a carbon doped silicon dioxide material, the type of amphiphilic nonionic surfactant depends on the level of carbon doping. Typical carbon-doped silicon dioxide (CDO) low-k dielectric materials have a formula of $Si_wC_xO_yH_z$ where x is approximately (0.10–0.25)y. When x is equal to zero, the material is the same as an undoped silicon dioxide with which the amphiphilic nonionic surfactants have little to no interaction. When the silicon dioxide material is modified with organic groups (i.e., x>0), the surface of the substrate becomes increasingly hydrophobic. While not wishing to be bound to theory, it is believed that the hydrophobic nature of the doped silicon dioxide materials drives adsorption of the nonionic amphiphilic surfactants onto the surface. At low levels of carbon doping, the hydrophobic head group desirably is larger so as to more completely cover the surface of the CDO layer. For example, at low levels of carbon doping, the head group can be polypropylene or polypropylene oxide. As the level of doping increases, the size of the hydrophobic head group can be smaller.

The length of the hydrophilic tail group is important for controlling the polishing environment above the surface of the low-k dielectric material. If the hydrophilic tail groups are too small, the steric barrier is insufficient to prevent chemical attack and/or removal of the substrate surface by abrasion. By selecting amphiphilic nonionic surfactants having long, bulky hydrophilic tail groups, a thick steric barrier can be created at the surface of the low-k material thereby substantially reducing the rate of low-k dielectric layer removal. Such amphiphilic nonionic surfactants will have higher HLB values reflecting the high wt. % amount of the hydrophilic tail group.

A liquid carrier is used to facilitate the application of the abrasive (when present and suspended in the liquid carrier), amphiphilic nonionic surfactant, and any optional additives to the surface of a suitable substrate to be polished (e.g., planarized). The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

The polishing composition can have any suitable pH. Typically, the polishing composition has a pH of about 6 or greater (e.g., about 7 or greater, or about 8 or greater) and a pH of about 12 or lower (e.g., about 11 or lower).

The polishing system described herein can be used to polish (e.g., planarize) a substrate. The substrate comprises a low-k dielectric layer having a dielectric constant of about 3.5 or less (e.g., about 3 or less, or about 1 to about 3). For example, the dielectric layer can comprise an organically modified silicon glass such as carbon-doped silicon dioxide (CDO) or an organic polymer film such as a polymer selected from the group consisting of polyimide, fluorinated polyimide, polyarylenes and polyarylene ethers (such as SiLK™ from Dow Chemical, FLARE™ from Allied Signal, and VELOX™ from Schumacher), polybenzocyclobutene, divinyl siloxane bisbenzocyclobutene (DVS-BCB), polytetrafluoroethylene (PTFE), polysiloxane, polynaphthylene ether, polyquinolines, paralynes (such as Parylene AF4, an aliphatic tetrafluorinated poly-p-xylylene), copolymers thereof, and combinations thereof. Preferably, the low-k dielectric layer comprises carbon-doped silicon dioxide.

Optionally, the substrate further comprises an dielectric layer (e.g., silicon dioxide) and/or metal layer. The metal layer can comprise any suitable metal. For example, the metal layer can comprise copper, tantalum, titanium, tungsten, aluminum, nickel, platinum, ruthenium, iridium, rhodium, alloys thereof (e.g., binary alloys thereof and ternary alloys thereof), and combinations thereof. Preferably, the metal layer comprises copper and/or tantalum. The amphiphilic nonionic surfactant acts to suppress the removal rate of the low-k dielectric layer without substantially affecting the removal rates of any other layers (e.g., oxide layers, metal layers) that are present on the surface of the substrate.

The polishing system described herein optionally further comprises an oxidizing agent. The oxidizing agent can be any suitable oxidizing agent. Suitable oxidizing agents include inorganic and organic per-compounds, bromates, nitrates, chlorates, chromates, iodates, iron and copper salts (e.g., nitrates, sulfates, EDTA, and citrates), rare earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($So_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. Preferably, the secondary oxidizing agent is hydrogen peroxide, potassium monopersulfate (also known as postassium peroxymonosulfate and available as Oxone® oxidizing agent from DuPont with a reported chemical formula of 2KHSO$_5$·KHSO$_4$·K$_2$SO$_4$ (FW 614.78)), ammonium persulfate, or a combination thereof.

The polishing system described herein optionally further comprises a complexing agent or chelating agent. The complexing or chelating agent is any suitable chemical additive that enhances the removal rate of the substrate layer being removed. Suitable chelating or complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or poly-alcohols (e.g., ethylene glycol, pyrocatechol, pyrogallol, tannic acid, and the like) and amine-containing compounds (e.g., ammonia, amino acids, amino alcohols, di-, tri-, and polyamines, and the like). Preferably, the complexing agent is a carboxylate salt, more preferably an oxalate salt. The choice of chelating or complexing agent will depend on the type of substrate layer being removed in the course of polishing a substrate with the polishing composition.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof; phthalates include phthalic acid, as well as mono-salts (e.g., potassium hydrogen phthalate) and di-salts thereof; perchlorates include the corresponding acid (i.e., perchloric acid), as well as salts thereof. Furthermore, certain compounds or reagents may perform more than one function. For example, some compounds can function both as a chelating agent and an oxidizing agent (e.g., certain ferric nitrates and the like).

The polishing system described herein optionally further comprises a corrosion inhibitor. The corrosion inhibitor (i.e., a film-forming agent) can be any suitable corrosion inhibitor. Typically, the corrosion inhibitor is an organic compound containing a heteroatom-containing functional group. For example, the corrosion inhibitor is a heterocyclic organic compound with at least one 5- or 6-member heterocyclic ring as the active functional group, wherein the heterocyclic ring contains at least one nitrogen atom, for example, an azole compound. Preferably, the corrosion inhibitor is a triazole; more preferably, 1,2,4-triazole, 1,2,3-triazole, or benzotriazole.

The polishing system described herein optionally further comprises one or more components such as pH adjusters, regulators, or buffers, and the like. Suitable pH adjusters, regulators, or buffers can comprise, for example, sodium hydroxide, sodium carbonate, potassium hydroxide, potassium carbonate, sulfuric acid, hydrochloric acid, nitric acid, phosphoric acid, citric acid, potassium phosphate, mixtures thereof, and the like.

The polishing system described herein optionally further comprises one or more components such as anti-foaming agents and biocides. The anti-foaming agent and biocide can be any suitable anti-foaming and antifungal agents, respectively. The anti-foaming agent preferably is a polydimethylsiloxane polymer. The biocide preferably is Kathon® 886 biocide (Rohm and Haas).

The polishing system described herein is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to he surface of the polishing pad intended to contact a substrate to be polished. The polishing of the substrate takes place by the substrate being placed in contact with the polishing pad and then the polishing pad moving relative to the substrate, typically with a polishing composition of the invention therebetween, so as to abrade at least a portion of the substrate to polish the substrate. The CMP apparatus can be any suitable CMP apparatus, many of which are known in the art.

The following examples further illustrate the invention but, of course, should not be construed as in any way limiting its scope.

EXAMPLE 1

This example illustrates the benefit of amphiphilic nonionic surfactants on the substrate removal selectivity of low-k dielectric constant material removal in comparison to the removal rates of copper, tantalum, and silicon dioxide materials.

Similar blanket wafer substrates containing tantalum (Ta), silicon dioxide (SiO$_2$), or carbon-doped silicon dioxide (CDO) were polished with different polishing compositions (Polishing Compositions 1A–1I). Each polishing composition contained 7 wt. % colloidal silica (120 nm to 150 nm mean particle diameter), 0.02 wt. % benzotriazole, 0.30 wt. % acetic acid, 3 wt. % hydrogen peroxide, and various concentrations of different surfactants, and had a pH of about 8. Polishing Composition 1A (comparative) contained the anionic surfactant, ammonium polymethacrylate (Daxad® 32 surfactant, Hampshire Chemicals), at 1000 ppm concentration. Polishing Composition 1B (comparative) contained cationic polyethylenamine (Lupasol® SKA surfactant, BASF). Polishing Compositions 1C–1E (invention) contained nonionic surfactants, specifically EO/PO block copolymer surfactants, Pluronic® 31R1 surfactant (PO/EO/PO, 10% polyoxyethylene, MW=3250, BASF), Pluronic® L101 surfactant (EO/PO/EO, 10% polyoxyethylene, MW=3800, HLB=1, BASF), polydimethylsiloxane with polyoxyethylene-co-polyoxypropylene side chains (Silwet® 7001 surfactant, HLB 13–17, OSI Specialties), and poly(2-ethyl-2-oxazoline) (Aquazol® 50 surfactant, MW=50 k, Polymer Chemistry Innovations), respectively. Polishing Compositions 1F–1I (invention) contained sorbitan ester surfactants, specifically sorbitan monolaurate, sorbitan monopalmitate, sorbitan sesquioleate, and sorbitan trioleate, respectively.

The removal rates for each of Polishing Compositions 1A–1I were determined for the tantalum, silicon dioxide, and carbon-doped silicon dioxide layers of the substrate. The percent reduction (% Drop) in removal rate (RR) as a result of the presence of the surfactants for each polishing composition is summarized in Table 1.

TABLE 1

| Polishing Composition | Surfactant | Amount (ppm) | % Drop Ta RR | % Drop SiO$_2$ RR | % Drop CDO RR |
|---|---|---|---|---|---|
| 1A (comparative) | ammonium polymethacrylate (anionic) | 1000 | −16.1 | −24.2 | −18.4 |
| 1B (comparative) | polyethyleneamine (cationic) | 100 | 7.0 | −8.0 | — |
|  |  | 500 | 61.5 | 64.0 | 55.1 |
| 1C (invention) | EO/PO/EO (Pluronic ® L101) | 100 | 7.7 | −5.4 | 44.5 |
|  |  | 1000 | 43.2 | 55.5 | 67.8 |
| 1D (invention) | EO/PO/EO (Pluronic ® 31R1) | 100 | 10.2 | −2.1 | 53.9 |
|  |  | 500 | 40.5 | 15.9 | 66.2 |
| 1E (invention) | EO/PO polydimethylsiloxane (Silwet ® 7001) | 100 | 0 | −10.1 | 40.1 |
|  |  | 1000 | 36 | 38.3 | 74.7 |
| 1F (invention) | sorbitan monolaurate | 100 | 9.4 | 15.0 | 40.7 |
|  |  | 500 | 3.1 | 15.3 | 48.7 |
| 1G (invention) | sorbitan monopalmitate | 500 | 8.1 | 0.9 | 25.4 |
| 1H (invention) | sorbitan sesquioleate | 500 | 8.7 | 5.5 | 30.5 |
| 1I (invention) | sorbitan trioleate | 500 | 10.6 | 4.9 | 28.6 |

The results summarized in Table 1 demonstrate that the presence of amphiphilic nonionic surfactants can reduce the removal rate of a dielectric layer having a dielectric constant of about 3.5 or lower, such as a CDO substrate layer, while leaving the removal rates of the other substrate materials (e.g., metal and/or oxide layers) substantially unchanged.

EXAMPLE 2

This example illustrates the effect of amphiphilic nonionic surfactants on the substrate removal rate of a low-k dielectric constant material as a function of surfactant concentration.

Similar blanket wafer substrates containing tantalum (Ta), silicon dioxide (PETEOS), or Black Diamond® low-k dielectric (Applied Materials) materials were polished with different polishing compositions (Polishing Compositions 2A–2E). Polishing Composition 2A (control) contained 12 wt. % colloidal silica, 0.10 wt. % benzotriazole, 0.3 wt. % acetic acid, 3 wt. % hydrogen peroxide, and no surfactant at a pH of about 10 (adjusted with KOH). Polishing Compositions 2B–2E (invention) were the same as Polishing Composition 2A except that they contained 50, 100, 200, and 400 ppm polyoxyethylene(40)nonylphenyl ether (Igepal® CO-890 surfactant, Rhone-Poulenc), respectively. The removal rates (RR) of the tantalum, PETEOS, and low-k dielectric were determined for each of the polishing compositions. The results are summarized in Table 2 and FIG. 1.

TABLE 2

Removal Rate as a function of Surfactant Concentration

| Polishing Composition | Surfactant | Surfactant Concentration (ppm) | Ta RR (Å/min) | PETEOS RR (Å/min) | Low-k Dielectric RR (Å/min) |
|---|---|---|---|---|---|
| 2A (control) | None | 0 | 1013 | 1082 | 2600 |
| 2B (invention) | Igepal ® CO-890 | 50 | 1019 | 1034 | 786 |
| 2C (invention) | Igepal ® CO-890 | 100 | 1005 | 1052 | 503 |
| 2D (invention) | Igepal ® CO-890 | 200 | 972 | 1006 | 375 |
| 2E (invention) | Igepal ® CO-890 | 400 | 912 | 964 | 328 |

The results summarized in Table 2 demonstrate that the presence of an amphiphilic nonionic surfactant has a profound effect on the removal rate of low-k dielectric material but only a minor effect on the removal rate of the tantalum and PETEOS layers.

EXAMPLE 3

This example illustrates the effect of amphiphilic nonionic surfactants on the substrate removal rate of a low-k dielectric constant material as a function of surfactant HLB value.

Similar blanket wafer substrates containing tantalum (Ta), silicon dioxide (TEOS), or carbon-doped silicon dioxide (CDO) were polished with different polishing compositions (Polishing Compositions 3A–3E). Each of the polishing compositions contained 12 wt. % colloidal silica, 0.10 wt. % benzotriazole, 0.30 wt. % acetic acid, 3 wt. % hydrogen peroxide, and 200 ppm surfactant with a pH of about 10. Polishing Compositions 3A–3E (invention) contained polyoxyethylene(2)isooctylphenyl ether (Igepal® CO-210 surfactant, Rhone Poulenc) having an HLB of 4.6, polyoxyethylene(5)isooctylphenyl ether (Igepal® CO-520 surfactant, Rhone Poulenc) having an HLB of 10, polyoxyethylene(9)nonylphenyl ether (Igepal® CO-630 surfactant, Rhone Poulenc) having an HLB of 13, polyoxyethylene(40)nonylphenyl ether (Igepal® CO-890 surfactant, Rhone Poulenc) having an HLB of 17.8, and polyoxyethylene(100)nonylphenyl ether (Igepal® CO-990 surfactant, Rhone Poulenc) having an HLB of 19, respectively. The removal rates (RR) of the Ta, TEOS, and CDO layers were determined for each of the polishing composi- The removal rates for each of Polishing Compositions 4A–4F were determined for the tantalum, silicon dioxide, and carbon-doped silicon dioxide layers of the substrate. The percent reduction (% Drop) in removal rate (RR) as a result of the presence of the surfactants for each polishing composition is summarized in Table 4.

TABLE 4

Figure 2:
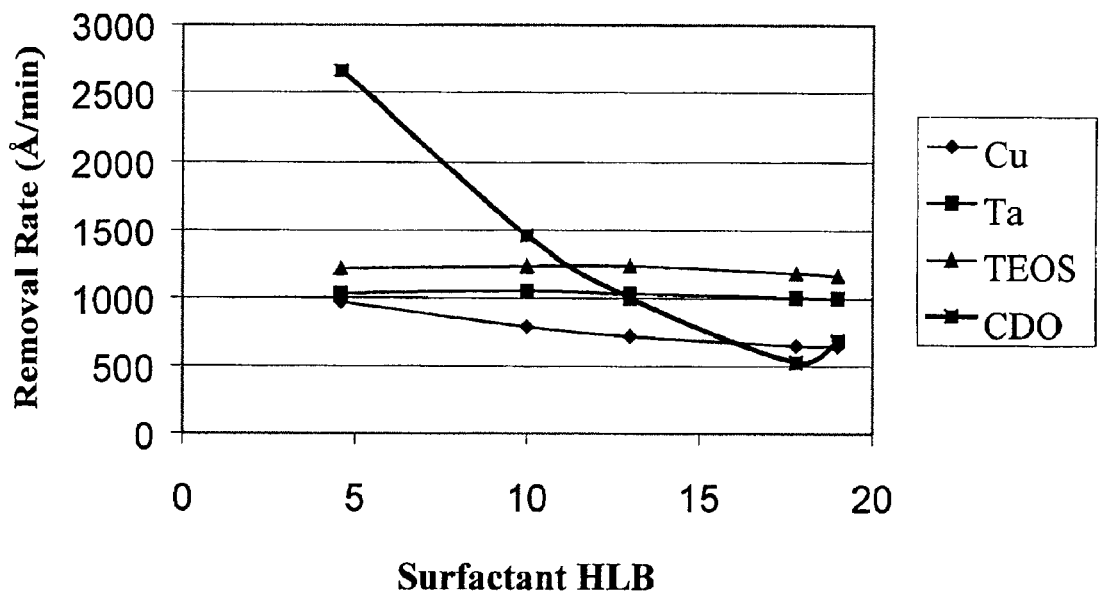
FIG. 2 is a plot showing the relationship between the surfactant HLB value and the removal rates of the tantalum (Ta), silicon dioxide (TEOS), and low-k dielectric material (CDO).

| Polishing Composition | Surfactant | Head Group | Tail Group | % Drop Ta RR | % Drop $SiO_2$ RR | % Drop CDO RR |
|---|---|---|---|---|---|---|
| 4A (control) | none | — | — | 0 | 0 | 0 |
| 4B (invention) | Surfynol ® 485 (75 ppm) | $Me_4$decyne | Dual $(EO)_{15}$ | −0.4 | −12.9 | 59.1 |
| 4C (invention) | Surfynol ® 485 (150 ppm) | $Me_4$decyne | Dual $(EO)_{15}$ | 2.4 | −8.5 | 71.7 |
| 4D (invention) | Surfynol ® 485 (300 ppm) | $Me_4$decyne | Dual $(EO)_{15}$ | 4.5 | 0.0 | 63.0 |
| 4E (invention) | Surfynol ® 485 (1000 ppm) | $Me_4$decyne | Dual $(EO)_{15}$ | 19.2 | 7.5 | 70.4 |
| 4F (comparative) | Surfynol ® 104P (1000 ppm) | $Me_4$decynol | none | 11.8 | 4.0 | 21.4 | tions. The results are summarized in Table 3 and FIG. 2.

TABLE 3

Removal Rate as function of HLB

| Polishing Composition | Surfactant (200 ppm) | HLB | Ta RR (Å/min) | TEOS RR (Å/min) | CDO RR (Å/min) |
|---|---|---|---|---|---|
| 3A | Igepal ® CO-210 | 4.6 | 1033 | 1219 | 2667 |
| 3B | Igepal ® CO-520 | 10 | 1051 | 1237 | 1459 |
| 3C | Igepal ® CO-630 | 13 | 1031 | 1237 | 1003 |
| 3D | Igepal ® CO-890 | 17.8 | 1004 | 1184 | 529 |
| 3E | Igepal ® CO-990 | 19 | 1000 | 1164 | 689 |

The results in Table 3 demonstrate that the removal rate of low-k dielectric materials decreases with increasing surfactant HLB value while the removal rates of other substrate layers (e.g, metal and oxide layers) are substantially unaffected.

EXAMPLE 4

This example illustrates the benefit of amphiphilic nonionic surfactants containing one head group and two tail groups on the substrate removal selectivity of low-k dielectric constant material removal in comparison to the removal rates of tantalum and silicon dioxide materials.

Similar substrates containing tantalum, silicon dioxide, and carbon-doped silicon dioxide (CDO) layers were polished with different polishing compositions (Polishing Compositions 4A–4F). Each of the polishing compositions contained 7 wt. % colloidal silica and 0.02 wt. % benzotriazole at a pH of about 8. Polishing Composition 4A (control) contained no surfactant. Polishing Compositions 4B–4E (invention) contained 75, 150, 300, and 1000 ppm 2,4,7,9-tetramethyl-5-decyne-4,7-diol ethoxylate (30) (Surfynol® 485 surfactant, Air Products) having an HLB value of 17, respectively. Each of the amphiphilic nonionic surfactants used with Polishing Compositions 4B–4E contains one head group and two tail goups. Polishing Composition 4F (comparative) contained 200 ppm 2,4,7,9-tetramethyl-5-decyne-4,7-diol (Surfynol® 104PA surfactant, Air Products) having an HLB value of 4.

The results summarized in Table 4 demonstrate that acetylenic glycol surfactants having a tetramethyldecyne head group and multiple polyoxyethylene tail groups have a dramatic effect on the removal rate of the low-k dielectric material without substantially affecting the removal rates of the other metal or oxide layers.

EXAMPLE 5

This example illustrates the benefit of amphiphilic nonionic surfactants on the substrate removal selectivity of low-k dielectric constant material removal in comparison to the removal rate of tantalum and silicon dioxide materials.

Similar blanket wafer substrates containing tantalum, silicon dioxide, or carbon-doped silicon dioxide (CDO) layers were polishing with different polishing compositions (Polishing Compositions 5A–5K). Each of the polishing compositions contained 12 wt. % abrasive, 0.02 wt. % benzotriazole, and 167 ppm surfactant and had a pH of about 10. Polishing Composition 5A (comparative) contained polyethylene glycol having a molecular weight of 600 ($EO_{14}$). Polishing Compositions 5B–5F (invention) each contained triblock copolymers of polyoxyethylene and polyoxypropylene (EO/PO/EO), specifically $EO_{20}$-$PO_{70}$-$EO_{20}$, $EO_1$-$PO_{17}$-$EO_1$, $EO_{13}$-$PO_{30}$-$EO_{13}$, $EO_{76}$-$PO_{29}$-$EO_{76}$, and $EO_{11}$-$PO_{16}$-$EO_{11}$, respectively. Polishing Compositions 5G–5I (invention) each contained block copolymers of polyethylene and polyoxyethylene, specifically $PE_{12}$-$EO_4$, $PE_8$-$EO_{10}$, and $PE_8$-$EO_{41}$, respectively. Polishing Compositions 5J and 5K (invention) contained octylphenyl polyoxyethylene and octylcyclohexyl polyoxyethylene (Triton® X-100 and Triton® X-100R surfactants, Union Carbide), respectively.

The removal rates for the tantalum, silicon dioxide, and CDO blanket wafers were determined for each of the polishing compositions, and the percent reduction (% Drop) in the removal rates (RR) for the different layers are summarized in Table 5.

TABLE 5

| Polishing Composition | Surfactant | Head Group | Tail Group | % Drop Ta RR | % Drop SiO$_2$ RR | % Drop CDO RR |
|---|---|---|---|---|---|---|
| 5A (comparative) | PEG 600 | none | (EO)$_{14}$ | 3.6 | 9.7 | 12.4 |
| 5B (invention) | EO/PO/EO | (PO)$_{70}$ | dual (EO)$_{20}$ | 36.1 | 42.6 | 69.4 |
| 5C (invention) | EO/PO/EO | (PO)$_{17}$ | Dual (EO)$_1$ | 6.9 | 10.7 | 53.4 |
| 5D (invention) | EO/PO/EO | (PO)$_{30}$ | dual (EO)$_{13}$ | 0.9 | 1.7 | 75.6 |
| 5E (invention) | EO/PO/EO | (PO)$_{29}$ | dual (EO)$_{76}$ | 9.1 | 7.0 | 41.2 |
| 5F (invention) | EO/PO/EO | (PO)$_{16}$ | dual (EO)$_{11}$ | -0.1 | -1.9 | 60.9 |
| 5G (invention) | PE/PEG 870 | (PE)$_{12}$ | (EO)$_4$ | 0.9 | 7.6 | 2.1 |
| 5H (invention) | PE/PEG 920 | (PE)$_8$ | (EO)$_{10}$ | 0.9 | 6.4 | 38.8 |
| 5I (invention) | PE/PEG MP 89C | (PE)$_8$ | (EO)$_{41}$ | 6.9 | 13.0 | 69.5 |
| 5J (invention) | Triton ® X-100 | octylphenyl | (EO)$_9$ | 0.8 | 0.9 | 54.0 |
| 5K (invention) | Triton ® X-100R | octyl-cyclohexyl | (EO)$_9$ | 8.5 | 10.3 | 54.1 |

The results summarized in Table 5 demonstrate that the presence of amphiphilic nonionic surfactants in the polishing system reduces the removal rate of low-k dielectric materials without substantially affecting the removal rates of other substrate layers.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate comprising:
   (i) contacting a substrate comprising (A) a metal layer selected from the group consisting of copper, tantalum, titanium, tungsten, nickel, platinum, ruthenium, iridium, and rhodium, and (B) a dielectric layer with a chemical-mechanical polishing system comprising:
      (a) (1) an abrasive selected from the group consisting of alumina, silica, co-formed products thereof, coated metal oxide particles, polymer particles, and combinations thereof, (2) a polishing pad, or (3) a combination of items (1) and (2),
      (b) an amphiphilic nonionic surfactant,
      (c) an oxidizing agent, and
      (d) a liquid carrier, and
   (ii) abrading at least a portion of the substrate to polish the substrate,
   wherein the dielectric layer has a dielectric constant of about 3.5 or lower, and wherein the amphiphilic nonionic surfactant is (A) a 2,4,7,9-tetramethyl-5-decyne-4,7-diol ethoxylate, (B) selected from the group consisting of polyoxyethylene alkyl ethers and polyoxyethylene alkyl acid esters, wherein the alkyl is a C$_{6-30}$ alkyl, which can be saturated or partially unsaturated, and is optionally branched, (C) a polyoxyethylenesorbitan alkyl acid ester, wherein the alkyl is a C$_{6-30}$ alkyl, can be saturated or partially unsaturated, and can be optionally branched, (D) a block copolymer comprising polyoxyethylene and polyoxypropylene, or polyoxyethylene and polyethylene, or (E) selected from the group consisting of polyoxyethylene alkyl amines, polyoxyethylene alkyl alkanolamides, and combinations thereof.

2. The method of claim 1, wherein the amphiphilic nonionic surfactant has an HLB of about 7 or greater.

3. The method of claim 1, wherein the amphiphilic nonionic surfactant is a 2,4,7,9-tetramethyl-5-decyne-4,7-diol ethoxylate.

4. The method of claim 1, wherein the amphiphilic nonionic surfactant is selected from the group consisting of polyoxyethylene alkyl ethers and polyoxyethylene alkyl acid esters, wherein the alkyl is a $C_{6-30}$ alkyl, which can be saturated or partially unsaturated, and is optionally branched.

5. The method of claim 4, wherein the amphiphilic nonionic surfactant is a polyoxyethylene lauryl ether, polyoxyethylene cetyl ether, polyoxyethylene stearyl ether, polyoxyethylene oleyl ether, polyoxyethylene monolaurate, polyoxyethylene monostearate, polyoxyethylene distearate, polyoxyethylene monooleate, or a combination thereof.

6. The method of claim 4, wherein the amphiphilic nonionic surfactant is a polyoxyethylene alkylphenyl ether or a polyoxyethylene alkylcyclohexyl ether, wherein the alkyl is a $C_{6-30}$ alkyl, can be saturated or partially unsaturated, and can be optionally branched.

7. The method of claim 1, wherein the amphiphilic nonionic surfactant is a polyoxyethylenesorbitan alkyl acid ester, wherein the alkyl is a $C_{6-30}$ alkyl, can be saturated or partially unsaturated, and can be optionally branched.

8. The method of claim 1, wherein the amphiphilic nonionic surfactant is a block copolymer comprising polyoxyethylene and polyoxypropylene, or polyoxyethylene and polyethylene.

9. The method of claim 1, wherein the amphiphilic nonionic surfactant is selected from the group consisting of polyoxyethylene alkyl amines, polyoxyethylene alkyl alkanolamides, and combinations thereof.

10. The method of claim 1, wherein the system has a pH of about 6 or greater.

11. The method of claim 1, wherein the system comprises an abrasive.

12. The method of claim 11, wherein the abrasive is suspended in the liquid carrier.

13. The method of claim 12, wherein the system further comprises a polishing pad.

14. The method of claim 1, wherein the liquid carrier comprises water.

15. The method of claim 1, wherein the polishing system comprises about 0.005 wt. % or more amphiphilic nonionic surfactant, based on the weight of the liquid carrier and any compounds dissolved or suspended therein.

16. The method of claim 11, wherein the polishing system comprises about 0.005 wt. % to about 0.05 wt. % amphiphilic nonionic surfactant, based on the weight of the liquid carrier and any compounds dissolved or suspended therein.

17. The method of claim 1, wherein the dielectric layer is an organically modified silicon glass.

18. The method of claim 12, wherein the dielectric layer is carbon-doped silicon dioxide.

19. The method of claim 1, wherein the metal layer comprises copper or tantalum.

20. The method of claim 1, wherein the oxidizing agent is selected from the group consisting of hydrogen peroxide, potassium monopersulfate, ammonium persulfate, and mixtures thereof.

21. The method of claim 20, wherein the oxidizing agent is hydrogen peroxide.

22. A method of polishing a substrate comprising:
(i) contacting a substrate comprising (A) a metal layer selected from the group consisting of copper, tantalum, titanium, tungsten, nickel, platinum, ruthenium, iridium, and rhodium, and (B) a dielectric layer, with a chemical-mechanical polishing system comprising:
(a) (1) an abrasive selected from the group consisting of alumina, silica, co-formed products thereof, coated metal oxide particles, polymer particles, and combinations thereof, (2) a polishing pad, or (3) a combination of items (1) and (2),
(b) an amphiphilic nonionic surfactant, and
(c) a liquid carrier, and
(ii) abrading at least a portion of the substrate to polish the substrate,
wherein the dielectric layer has a dielectric constant of about 3.5 or lower, and wherein the amphiphilic nonionic surfactant is (A) a 2,4,7,9-tetraethyl-5-decyne-4,7-diol ethoxylate, (B) a block copolymer comprising polyoxyethylene and polyoxypropylene, or polyoxyethylene and polyethylene, (C) selected from the group consisting of polyoxyethylene alkyl amines, polyoxyethylene alkyl alkanolamides, and combinations thereof, or (D) a polyoxyethylenesorbitan alkyl acid ester, wherein the alkyl is a $C_{6-30}$ alkyl, can be saturated or partially unsaturated, and can be optionally branched.

23. The method of claim 22, wherein the amphiphilic nonionic surfactant has an HLB of about 7 or greater.

24. The method of claim 22 wherein the system has a pH of about 6 or greater.

25. The method of claim 22, wherein the system comprises an abrasive.

26. The method of claim 25, wherein the abrasive is suspended in the liquid carrier.

27. The method of claim 26, wherein the system further comprises a polishing pad.

28. The method of claim 22, wherein the polishing system comprises about 0.005 wt. % or more amphiphilic nonionic surfactant, based on the weight of the liquid carrier and any compounds dissolved or suspended therein.

29. The method of claim 25, wherein the polishing system comprises about 0.005 wt. % to about 0.05 wt. % amphiphilic nonionic surfactant, based on the weight of the liquid carrier and any compounds dissolved or suspended therein.

30. The method of claim 22, wherein the dielectric layer is an organically modified silicon glass.

31. The method of claim 26, wherein the dielectric layer is carbon-doped silicon dioxide.

32. The method of claim 22, herein the metal layer comprises copper or tantalum.

* * * * *